(12) United States Patent
Montano et al.

(10) Patent No.: US 6,616,976 B2
(45) Date of Patent: Sep. 9, 2003

(54) PROCESS FOR TREATING ADHESION PROMOTED METAL SURFACES WITH EPOXY RESINS

(75) Inventors: Joseph R. Montano, Boston, MA (US); James G. Shelnut, Northboro, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/995,890

(22) Filed: Nov. 28, 2001

(65) Prior Publication Data

US 2002/0106458 A1 Aug. 8, 2002

Related U.S. Application Data

(60) Provisional application No. 60/253,472, filed on Nov. 28, 2000.

(51) Int. Cl.$^7$ .............................. B05D 1/36; B05D 3/10
(52) U.S. Cl. ....................................... 427/327; 427/410
(58) Field of Search ................................ 427/410, 327

(56) References Cited

U.S. PATENT DOCUMENTS

| | | | | |
|---|---|---|---|---|
| 3,948,703 A | * | 4/1976 | Kushibe | ..................... 216/106 |
| 4,428,987 A | * | 1/1984 | Bell et al. | .................... 148/274 |
| 5,514,729 A | | 5/1996 | Diamant et al. | |
| 5,602,193 A | | 2/1997 | Stark | |
| 5,623,031 A | | 4/1997 | Imura et al. | |
| 5,741,835 A | | 4/1998 | Stark | |
| 5,869,130 A | * | 2/1999 | Ferrier | ..................... 106/14.05 |
| 5,910,548 A | | 6/1999 | Murata et al. | |
| 6,054,061 A | * | 4/2000 | Bayes et al. | .................... 134/2 |

FOREIGN PATENT DOCUMENTS

| | | | |
|---|---|---|---|
| JP | 03-42076 | * | 2/1991 |
| WO | WO 96/19097 | * | 6/1996 |

* cited by examiner

Primary Examiner—Erma Cameron
(74) Attorney, Agent, or Firm—John J. Piskorski

(57) ABSTRACT

A method for treating a micro-roughened metal surface to improve bonding between the metal surface and a polymer material. The method involves post-treating the micro-roughened conversion coated metal surface with an epoxy resin composition after having formed the micro-roughened conversion coated metal surface with an adhesion promotion composition. The method can be employed in the circuit board industry to improve bonding between innerlayers in a multiplayer circuit board.

18 Claims, No Drawings

PROCESS FOR TREATING ADHESION PROMOTED METAL SURFACES WITH EPOXY RESINS

This application claims the benefit of U.S. Provisional Application No. 60/253,472 filed Nov. 28, 2000.

BACKGROUND OF THE INVENTION

The present invention is directed to a method of improving adhesion between metal and polymeric materials. More specifically, the present invention is directed to a method of improving adhesion between metal and polymeric materials by treating the metal with an epoxy resin following an adhesion promotion step.

Printed circuits containing one or more circuitry innerlayers are in prominent use today as demand increases for further and further weight and space conservation in electronic devices.

In a fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern. One or more circuitry innerlayers of any particular type or types of circuitry pattern, as well as circuitry innerlayers which might constitute ground planes and power planes, are assembled into a multilayer circuitry by interposing one or more partially-cured dielectric substrate material layers (so called "pre-preg" layers) between the circuitry innerlayers to form a composite of an alternating circuitry innerlayers and dielectric substrate material. The composite is then subjected to heat and pressure to cure the partially cured substrate material and achieve bonding of circuitry innerlayers thereto. The cured composite will then have a number of through holes drilled therethrough, which are then metallized to provide a means for conductively interconnecting all circuitry layers. In the course of the through hole metallizing process, desired circuitry patterns will also typically be formed in the outer facing layers of the multilayer composite.

An alternate approach to the formation of a multilayer printed circuit board is through additive or surface laminer circuitry techniques. These techniques begin with a nonconductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other nonconductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are incorporated herein by reference in their entirety, involving oxides formed from relatively high chlorite/relatively low caustic copper oxidizing compositions, and producing substantially improved results in circuitry inner layer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or neat the through hole. This localized dissolution of the copper oxide, which is evidenced by formation around the through-hole of a pink ring or halo (owing to the pink color of the underlying copper metal thereby exposed), can in turn lead to localized delamination in the multilayer circuit. The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al., U.S. Pat. No. 4,902,551 to Nakaso et al., and U.S. Pat. No. 4,981,560 to Kajihara et al., and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e. (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promotion layer of copper oxide is formed on the circuit elements followed by a controlled dissolution and removal of a substantial amount of the copper oxide in a manner which does not adversely affect the topography.

PCT Application No. WO96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130, to Ferrier entitled "Process For Improving Adhesion of Polymeric Materials to Metal Surfaces" describes a process for improving the adhesion of polymeric materials to a metal surface, especially copper or copper alloy surfaces in the production of multilayer printed circuits. The process described in this patent application provides for contacting the metal surface with an adhesion-promoting composition comprising (a) an oxidizer; (b) an acid; (c) a corrosion inhibitor; (d) a source of halide ions; and (e) optionally, a water soluble polymer. That process provided excellent adhesion between the metallic and polymeric surfaces (i.e. the circuitry and the intermediate insulating layer), while eliminating or minimizing pink ring and operating economically, as compared to above noted conventional processes.

However, it has been found that the use of acidic peroxide treatment solutions, while giving good peel strength and stability of copper laminated to fiberglass filled resin, allows the occurrence of some flaws on further processing of the laminated board to create a finished printed circuit board. Thus, with some resin systems, particularly lower Tg materials, drilling removes a small quantity of organic material from the surface of the etch treated copper at the point where the drill intersects with the copper layer; this phenomenon is called "wedge". Further processing the drilled board through the chemical steps of preparing and plating the board creates a small area at the treated copper surface around the drilled hole where the coating is attacked and removed, creating a phenomenon called "pink ring". This area of pink ring is much smaller than the pink ring observed in standard oxide processing to prepare copper surfaces for lamination. Nevertheless, in this area of attack small areas of resin contracting from the copper surface can be observed after floating the board in molten solder. Although these areas of resin contraction (called "resin voids") may not be sufficient cause for rejection of the board they are still a concern.

In particular, it has been found that these wedge, pink ring and resin void flaws can be greatly reduced or eliminated by processing the board treated with these acidic peroxide treatment solutions through a strongly alkaline post treatment, followed by rinsing and drying.

U.S. Pat. No. 6,020,029 to Ferrier et al. discloses an acidic peroxide, adhesion promotion composition containing an oxidizer, an acid, a corrosion inhibitor, optionally a source of halide ions and optionally a water soluble polymer. Preferably, the water-soluble polymer is not a wetting agent or surfactant, but a water soluble homopolymer or copolymer of low molecular weight. The composition is applied to a metal surface. After the acidic peroxide solution is applied to the metal, the metal is post-treated with a strong alkaline solution followed by rinsing with water. After the metal is post-treated, a polymeric material is bonded to the metal surface. The '029 patent alleges that the combination of the halide and water soluble polymer in the acidic peroxide composition provide the best bonding results between the metal surface and the polymeric material.

WO 00-02426 discloses another method for addressing bond integrity between a metal surface and a polymeric coating. The method disclosed in the WO 00-02426 patent is to convert cupric-based organometallic compounds into cuprous-based organometallic conversion coatings to improve bonding integrity. The process is achieved by reduction and/or by partial dissolution of the organometallic coating, and optionally applying a copper oxidation inhibitor. Reducing agents employed include aminoboranes and dissolution agents include cupric ion chelators, organic or inorganic acids and their salts. Copper oxidation inhibitors include azole derivatives, including halogen substituted derivatives thereof. Cationic, amphoteric, anionic and/or non-ionic surface active agents may be included in the composition to enhance the effectiveness of the composition.

Although there are numerous methods of improving the bonding integrity between a metal surface and a polymeric material, there is still a desire and a need in the circuit board industry to increase adhesion between a metal surface and a polymeric material. Many of the above disclosed methods employ treatment solutions that are acidic or alkaline and cause the formation of a textured surface on the metal. However, none of the above-disclosed methods attempt to exploit the textured metal surface to further enhance bonding between the metal and the polymeric material. Accordingly, there is a need for a process that exploits the textured surface of the metal to improve the adhesive properties between the metal and polymeric material.

SUMMARY OF THE INVENTION

The present invention is directed to a process and composition for improving the adhesion between a metal surface and a polymeric material by treating the metal surface with an adhesion promotion composition followed by contacting the treated metal surface with an epoxy resin composition. The epoxy resin composition may be aqueous based, or organic based. The epoxy resin composition makes the metal surface more accessible to contact with a polymeric material that is coated on the metal surface. After the treated metal surface is post-treated with the epoxy resin composition, the polymeric material is placed on the surface of the metal to form a high integrity bond between the metal surface and the polymer material. Advantageously, the method and composition of the present invention provide for improved adhesion between a metal surface and a polymeric material as compared with known adhesion promoting processes. Accordingly, the adhesion between the metal surface and the polymeric material is such that multilayer circuit boards prepared using the method of the present invention may be employed in electronic devices without concern that the polymeric material may delaminate or peel from the metal surface.

Also, the post-treatment method of the present invention may be employed with many different adhesion promotion treatments to further improve adhesion between a metal surface and a polymeric material. Thus the process of the present invention is a readily available means of improving the adhesion promoting methods known in the circuit board industry.

An objective of the present invention is to provide a means of improving the adhesion integrity between a metal surface and a polymeric material.

Another objective is to provide an improved peel strength between a metal surface and a polymeric coating.

An additional objective of the present invention is to provide a multilayer circuit board that can be employed in electrical devices without concern that the circuit board will delaminate.

A further objective of the present invention is to provide a method of improving adhesion between a metal surface and a polymeric material that can be employed to improve known adhesion methods.

Additional objectives and advantages of the present invention will be apparent to those of skill in the art after reading the following description of the invention and the appended claims.

DETAILED DESCRIPTION OF THE INVENTION

The present invention is directed to a process of employing an aqueous or organic based composition of an epoxy resin to improve the adhesion of a polymeric material with a metal surface. Suitable compositions within the scope of the present invention are both aqueous and organic based. The epoxy resin composition is employed as a post-treatment step after treating a metal surface with an adhesion promoting composition. The adhesion promoting composition produces a micro-roughened surface on a metal substrate. While not being bound by any particular theory or mechanism, Applicants believe that post-treatment of the metal surface with the epoxy resin composition permits the epoxy resin to penetrate the textured metal surface thereby increasing contact between the metal surface and polymer material, and/or planarize the surface. A suitable epoxy resin composition within the scope of the present invention is an epoxy resin in a suitable quantity such that the epoxy resin provides contact between a polymeric material and the micro-roughened metal surface. Accordingly, any epoxy resin having the aforementioned properties may be employed to practice the present invention. Examples of suitable epoxides that may be employed to practice the present invention include, but are not limited to, epoxies having the following formula:

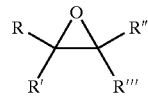

Where R, R', R", and R'" may be, independently, hydrogen; alkyl; aryl; an alkoxy group; an epoxy group; a phenoxy group; aralkyl; or a cyclic radical. R', R", and R'" are preferably hydrogen when R is alkyl, aryl, aralkyl, or a cyclic radical such as a cyclo-aliphatic radical. The epoxy, phenoxy, alkyl, aryl, aralkyl and cyclo-aliphatic groups may be unsubstituted, or substituted with an alkyl group, an aryl group, an arylkyl group, an amine group, or a halogen such as bromine or chlorine. The alkyl groups preferably range from one carbon to 20 carbons, most preferably from one carbon to 12 carbons.

Illustrative of the epoxies employed within the scope of the present invention include aliphatic epoxies, cycloaliphatic epoxies, bisphenol A-epoxies, 3,4-epoxy cyclohexyl methyl 3,4-epoxy cyclohexyl carboxylate, and the like. Also included are epoxy formulations based on glycidal ethers of para amino phenols as described in U.S. Pat. No. 5,514,729, the entire disclosure of which is hereby incorporated in its entirety by reference. Other suitable epoxy resins that may be employed to practice the present invention include, but are not limited to, bisphenol S, bisphenol F, novolak resins, the epoxy resins obtained from the reaction of bisphenol A and epihalohydrins, and the like. Such epoxy resins are described in U.S. Pat. No. 5,623,031, the entire disclosure of which is hereby incorporated in its entirety by reference. Other suitable epoxy resins that may be employed to practice the present invention are disclosed in U.S. Pat. Nos. 5,602,193; 5,741,835; and 5,910,548, the entire disclosures of which are hereby incorporated in their entireties by reference. The preferred epoxy resins include bisphenol A, bisphenol S, bisphenol F, novolak resins, and the like. The most preferred are the bisphenol A, novolak resins, and an epoxy resin obtained by the reaction of bisphenol A and epihalohydrin. An especially preferred epoxy resin obtained from the reaction between bisphenol A and epihalohydrin is the reaction between bisphenol A and epichlorohydrin.

The present process is particularly suited to the manufacture of multilayer printed circuit boards. Thus, in this application, the metal circuitry (usually copper) of the innerlayers is treated with an adhesion-promoting composition. After adhesion promotion treatment, optionally followed by water rinsing, the innerlayers are post-treated with an based epoxy resin composition. Optionally, another rinsing step may be employed before applying the polymer to the metal. The innerlayers are bonded together with polymeric materials such as pre-pregs or imageable dielectrics, resulting in the multilayer printed circuit board.

As mentioned above the epoxy resin compositions employed in the post-treatment process of the present invention may be an aqueous based, or organic based. The epoxy resin compositions may be true solutions or dispersions depending upon the solubility of the epoxy resin employed. Surfactants may be employed to solubilize the epoxy resins or disperse the epoxies in the solvent. Preferably, surfactants in the post-treatment compositions are avoided. The epoxy resin compositions are diluted with deionized water, or an organic solvent to make compositions containing from about 0.5% to about 5.0% by weight of the epoxy resin, preferably, from about 0.75% by weight to about 2.0% by weight of the composition. Preferably, the compositions of the present invention consist essentially of an epoxy resin and solvent without additional components.

The metal surface to be treated may comprise a variety of metals such as copper, nickel, iron and alloys of each of the foregoing. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

As mentioned above, any suitable adhesion promoting treatment process can be employed provided that the adhesion promoting composition produces a micro-roughened conversion-coated surface upon the metal. Such surfaces are particularly suited to bonding with polymeric material in contrast to non-treated metal surfaces. Such adhesion promoting baths may contain an oxidizer, an acid and a corrosion inhibitor. Such adhesion promoting compositions have pH ranges of from about 2.0 to as high as about 13.0. Additional components may be employed and modifications to such adhesion promoting compositions may be done as discussed below.

The oxidizer used in the adhesion-promoting composition may comprise any oxidizer that is capable of oxidizing the metal surface in the matrix of the adhesion-promoting composition. Hydrogen peroxide and persulfates are particulary preferred oxidizers for use in the process of the invention, with hydrogen peroxide being the most preferred oxidizer. The concentration of the oxidizer in the adhesion-promoting composition may range from at least about 0.01% by weight based on the total weight of the composition to as high as about 60.0% by weight. Preferably, the hydrogen peroxide is present from about 0.1 to about 20% by weight, more preferably from 0.5% to about 10%, and most preferably from about 1% to about 5%. Hydrogen peroxide is commercially available as, e.g., 35% by weight in water.

The adhesion-promoting compositions optionally may contain a stabilizing agent for hydrogen peroxide. Any suitable stabilizing agent for hydrogen peroxide may be used. Examples include, but are not limited to, dipicolinic acid, diglycolic acid and thiodiglycolic acid, ethylene diamine tetraacetic acid and its derivatives, magnesium salts of an aminopolycarboxylic acid, sodium silicate, phosphates and sulphonates. Stabilizers are added in amounts of from about 0.001% and preferably at least about 0.005% by weight of the adhesion promotion composition. More preferably, the concentration of the stabilizing agent varies between about 0.5 to about 5.0% by weight of the composition.

The acid utilized in the adhesion-promoting composition may be any acid that is stable in the matrix. Preferred acids are inorganic acids and may be employed as a single acid or a mixture of acids. A variety of inorganic acids may be used including, but not limited to, sulfuric acid, nitric acid, hydrochloric acid, phosphoric acid and mixtures thereof. Sulfuric acid, phosphoric acid or mixtures thereof is especially preferred. When a mixture of inorganic acids is used, the acids may be combined in any suitable ratio. A ratio of from about 99:1 to about 1:99, and preferably from about 75:25 to about 25:75 may be employed. When a mixture of sulfuric acid and phosphoric acid are used, preferably sulfuric acid is used in major amounts and phosphoric in minor amounts. The concentration of the acid in the adhesion-promoting composition may range from about 5 to about 360 grams per liter, preferably from about 70 to about 110 grams per liter.

The corrosion inhibitor used in the adhesion-promoting composition is a compound that effectively reacts with the metal surface to form a protective complex layer. Preferred corrosion inhibitors are pyrroles, azoles, oxazoles, thiazoles, pyrazoles, triazoles, benzotriazoles, tetrazoles, tolyltriazol, hydroxy-substituted azole compounds, imidazoles, benzimidazoles such as 5-methylbenzimidazole, 2-bromobenzyl benzimidazole, 2-chlorobenzyl benzimidazole, 2-bromophenyl benzimidazole, 2-chlorophenyl benzimidazole, 2-bromophenyl benzimidazole, 2-chloroethylphenyl benzimidazole and 2-undecyl-4-methylimidazole, or mixtures thereof. Hydroxy-substituted azole compounds may have more than one hydroxy substituent and may be further substituted, such as with a (C1–C6)alkyl, (C1–C6)alkoxy, halogen and the like. Suitable hydroxy-substituted azole compounds include, but are not limited to, hydroxy-substituted triazoles and hydroxy-substituted tetrazoles. 1-Hydroxybenzotriazole is a preferred hydroxy-substituted triazole. Examples of suitable benzotriazoles include, but are not limited to, benztriazole, carboxybenzoxtriazole and mixtures thereof. The corrosion inhibitors are available from a variety of commercial sources and may be employed without further purification. The concentration of the corrosion inhibitor in the adhesion-promoting composition may range from about 0.1 to about 20% by weight based on the total weight of the composition, preferably from about 0.2 to about 1% by weight, and most preferably from about 0.3 to about 0.6% by weight.

Optionally, a source of halide ions may be employed in the adhesion-promoting compositions. Any suitable source of halides may be employed as long as the source provides halide ions in the matrix of the adhesion-promoting composition. Examples of suitable sources of halide ions are alkali metal salts such as sodium chloride or potassium chloride, oxohalides such as sodium chlorate or potassium chlorate, or halide bearing mineral acids such as hydrochloric acid. The most preferred sources are halide sources that are free of surfactant groups, such, as tetraalkyl ammonium halides, such as tetraalkyl ammonium chloride, tetrabutyl ammonium chloride and mixtures thereof. The concentration of the source of halide ions in the adhesion-promoting composition may range from about 1 to about 50 ppm. When chloride is employed, the chloride ion is present in amounts of from about 1 to about 8 ppm, preferably from about 4 to about 7 ppm.

Optionally, the adhesion-promoting composition also comprises a water soluble polymer. The water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. Particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter.

An additional component that may be added to the adhesion composition or bath is an amine or a quaternary ammonium compound. The term amine as used herein is defined as a lower aliphatic, cycloaliphatic or aromatic amine, i.e. a primary, secondary or tertiary amine having C1 to C8 substitution. The term quaternary ammonium compound as used herein is also defined as a lower aliphatic, cycloaliphatic or aromatic compound. Each term excludes from its scope materials having fatty substitution or other surfactant groups. Each substituent on amine be aliphatic, cycloaliphatic or aromatic and each of such substituents may be further substituted with groups such as carboxyl, nitro, sulfonyl, hydroxyl, and the like. Exemplary amines include methyl amine, dimethylamine, trimethylamine, ethylamine, triethylamine, tripropylamine, isopropylamine, triallylamine, n-butylamine, t-butylamine, n-amylamine, cyclohexylamine, dicyclohexylamine, and the like. Exemplary quaternary ammonium compounds include tetramethylammonium hydroxide, tetraethylammonium hydroxide, and dimethyl-diethylammonium hydroxide, tetramethylammonium chloride, tetraethylammoium chloride and dimethyl-dimethylammonium chloride. The amines are used in a concentration of from about 0.01% by weight to about 2.5% by weight and more preferably, in a concentration of from about 0.1 to about 1.0% by weight.

Prior to adhesion-promotion and the post-treatment step, the metal surface, particularly copper, or a copper alloy surface, preferably is cleaned by mechanical or chemical cleaning and then contacted with the adhesion-promotion composition. The metal surface can be treated with the adhesion-promoting composition in a variety of ways, including immersion, spray, or flood. The temperature of the adhesion-promoting composition during treatment preferably does not exceed 75° C. and more preferably, at a temperature varying between about 20° C. to about 50° C. Contact time is at least about 1 second and preferably between about 5 seconds and about 2 minutes though the maximum contact time may be up to about 10 minutes. A contact time of about 1 minute or less is particularly preferred.

After the metal surface is treated with the adhesion-promoting composition, the metal is spray-coated, dip-coated, or roller-coated with the epoxy resin composition, or the composition is applied to the metal with a squeegee, or any suitable method may be employed to apply the epoxy resin. The methods and apparatus for applying the epoxy resin to the metal surface may be horizontal or vertical. Contact time between the treated metal and the epoxy resin composition ranges from about 1 second to about 1.5 minutes, preferably, between about 30 to about 60 seconds. Preferably, the post-treatment is done at a temperature of from about 18° C. to about 22° C. (room temperature). The post-treatment process may be performed at higher temperatures, however, there is no advantage to performing the process at temperatures above room temperature. Optionally, the treated metal may be rinsed with water prior to post-treatment and/or prior to placing the polymer material on the metal surface.

The polymer material may be placed on the metal surface to form a bond with the metal surface by any suitable method employed in the art. Mechanical pressure with heat is one method that is very suitable for joining the polymer to the metal surface. If heat is employed, the temperatures employed range from about 30° C. to about 110° C. The polymer material may be in the form of a polymeric photoresist, screen-resist solder mask, adhesive material and the like.

In another embodiment of the present invention, the metal surface may be treated with an alkaline solution after the acidic oxidant treatment but prior to the epoxy resin composition post-treatment. The preferred alkaline solution is an aqueous alkaline solution of alkali metal hydroxide (e.g. sodium hydroxide or potassium hydroxide); alkali metal carbonates (e.g. sodium carbonate or potassium carbonate); alkali metal phosphates (e.g. sodium phosphate or potassium phosphates); or amines or mixtures of those chemicals. The preferred amount of such chemicals in the aqueous solution depends upon the particular chemical employed as well as the exact use involved. Most preferably an aqueous solution of sodium or potassium hydroxide is used as the alkaline treatment, with the concentration of sodium or potassium hydroxide ranging from 2 to 150 grams per liter, most preferably from 25 to 50 grams per liter. Contact may be made by immersion, conveyorized flood or spray, however conveyorized flood is preferred. Contact time may range from about 20 seconds to about 10 minutes but about 1 to about 3 minutes is preferred. Contact temperature may range from room temperature to about 85° C. but about 20° C. to about 40° C. is preferred. This alkaline treatment reduces the number of flaws in the finished laminated product. After the alkaline treatment, the metal surface may be rinsed with water. The treated metal surface is then post-treated with the epoxy resin composition and then the metal surface is bonded to polymeric material by any suitable conventional process.

In another embodiment of the present invention, the adhesion-promoting step may be a process for converting cupric-based organometallic compounds on a copper surface into cuprous-based organometallic conversion coatings. Such a process is achieved by reduction and/or by partial dissolution of the organometallic coating, and optionally applying a copper oxidation inhibitor at the same time.

The reduction and/or dissolution composition contains a reducer and/or dissolution agent, and optionally a copper oxidation inhibitor. Examples of reducers include, but are not limited to, DMAB (dimethylaminoborane), diethylaminoborane, morpholine borane and the like. Other suitable reducers include ammonium, alkali and/or alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes (including formaldehyde and glyoxal), glyoxylic acid and reducing sugars. Electric current may be used as well.

Dissolution agents employed may include any of the known cupric ion chelators (complexors), organic or inorganic acids and/or their salts, (or a combination of them), can be utilized for the present application. Such dissolution agents include, but are not limited to, EDTA (ethylenediamine-tetraacetic acid), HEEDTA, NTA, DTPA, DCTA, Quadrol® (ethoxylated/propoxylated ethylene diamine derivative available from BASF), organic phosphates (Dequests®), organic acids (citric, tartaric, gluconic, glutamic, sulfamic, glycolic, glycine, malic, maleic, salicylic, ascorbic, formic, and the like), inorganic acids (hydrochloric, hydrofluoric, hydrobromic, nitric, chromic acids, and the like), and/or their ammonium hydroxide, pyrophosphates, and the like. Quadrol®, EDTA and phosphanates are preferred. Additionally, it may be advantageous to use the dissolution agents with one or more reducing agents.

Suitable oxidation inhibitors or corrosion inhibitors are disclosed above. Cationic, amphoteric, anionic and/or nonionic surfactants may also be utilized in the adhesion-promoting solution to enhance the effectiveness of the adhesion-promoting solution.

Proper pH, temperature, concentrations of components as well as treatment time are adjusted appropriately to insure effective reduction and/or dissolution of the cupric ion as disclosed in WO 00-02426 (PCT/US99/14983) published Jan. 13, 2000 (Applicant: Alpha Metals Inc.), the entire disclosure of which is hereby incorporated in its entirety by refernce.

After the cupric-based organometallic compounds on the copper surface is converted into cuprous-based organdmetallic compounds by reduction and/or dissolution, the copper is post-treated with the epoxy resin composition. The copper surface may be rinsed with water before and/or after the post-treatment followed by placing the polymer material on the copper surface.

The following examples further describes the process and composition of the present invention, however, the examples are not intended to limit the scope of the invention.

EXAMPLE 1

Seven 30.5 cm×30.5 cm RTF® copper foils each having a thickness of about 4 mm were employed. Each copper foil was treated with an aqueous adhesion-promoting solution having the formulation given below:

| | |
|---|---|
| Sulfuric acid | 4.5% by Volume |
| Hydrogen Peroxide (35%) | 3.5% by Volume |
| Benzotriazole | 9 gr/l |
| Tetrabutylammonium chloride (TBAC) | 12–18 ppm |
| Water | Balance |

Treatment was provided for in a conveyorized flood machine. Each copper foil was exposed to the adhesion-promoting solution for about 60 seconds. The copper foils in samples 2 and 5 were rinsed with deionized water after treatment. All foils, except the foil of sample 1 (control), were than post-treated with a 1% by weight aqueous composition of bisphenol A-epichlorohydrin based epoxy resin (EPI-REZ® 5522-WY-55 obtainable from Shell Chemical Company, Houston, Tex.) by dipping each copper foil into the composition for about 60 seconds. The temperatures of the post-treatment compositions were at about 20° C. After the copper foils of samples 2, 3, 5 and 6 were post-treated, the copper foils were rinsed with deionized water. The copper foils of samples 2–7 were then air-dried. The copper samples of 5–7 were baked at 100° C. for about 10 minutes. All of the foils were then pressed using Nelco® pre peg (polyethylene polymer), one sheet of 7628, 4000® series and two sheets of 1080, 4000® series. The press was done using the Wabash® press standard press cycle of about 1 hour and 45 minutes.

Peel strength testing was then performed on the foils by means of the Instron® Peel Tester, model #2530-437, apparatus. The peel strength is the force measured in pounds per inch required to separate the foil from the pre-preg material.

The results are given below:

| Sample | Rinse | Post-treatment | Rinse | Air-Dry | Bake at 100° C. for 10 minutes | Peel Strenght (lbs/in) |
|---|---|---|---|---|---|---|
| 1 (control) | NO | NO | NO | NO | NO | 5.4 |
| 2 | YES | YES | YES | YES | NO | 6.5 |
| 3 | NO | YES | YES | YES | NO | 6.5 |
| 4 | NO | YES | NO | YES | NO | 6.4 |
| 5 | YES | YES | YES | YES | YES | 5.9 |
| 6 | NO | YES | YES | YES | YES | 5.5 |
| 7 | NO | YES | NO | YES | YES | 6.3 |

The data show that post-treatment of an adhesion-promoting solution with an aqueous wetting composition of bisphenol A-epichlorohydrin based epoxy resin improves adhesion between a copper surface and a polymer material. The peel strength for the control of sample 1 had a peel strength of 5.4 lbs/in. In contrast, the peel strengths for all the other copper foils had peel strengths of 5.5 to as high as 6.5 lbs/in. Accordingly, multilayer circuit boards treated with the post-treament method of the present invention have improved bond integrity.

EXAMPLE 2

The tests performed in Example 1 above were re-done using a 1% by weight solution of EPI-REZ® 3520-WY-55 (obtainable from Shell Oil Company, Houston, Tex.). The copper foils were treated with the adhesion promotion solution of Example 1 for about 60 seconds, rinsed with deionized water and post-treated with the 1% by weight solution of EPI-REZ® 3520-WY-55 for about 60 seconds. Baking was done at about 100° C. for about 10 minutes.

All of the copper foils were then pressed with Nelco® pre-preg as in Example 1 above. The peel strength of each copper foil was then tested using the Instron® Peel Tester. The data and results are given in the table below.

| Sample | Rinse | Post-treatment | Rinse | Air-Dry | Bake at 100° C. for 10 minutes | Peel Strength (lbs/in) |
|---|---|---|---|---|---|---|
| 1 (control) | NO | NO | NO | NO | NO | 5.7 |
| 2 | YES | YES | YES | YES | NO | 4.9 |
| 3 | NO | YES | YES | YES | NO | 6.2 |
| 4 | NO | YES | NO | YES | NO | 6.4 |
| 5 | YES | YES | YES | YES | YES | 5.9 |
| 6 | NO | YES | YES | YES | YES | 6.2 |
| 7 | NO | YES | NO | YES | YES | 6.3 |

With the exception of sample 2, the results show that post-treatment of the copper foils with the 1% by weight aqueous solution of bisphenol A-epichlorohydrin based epoxy resin improves the peel strength of a polymeric material from a copper surface. The control has a value of 5.7 lbs/in. In contrast, the peel strengths of the post-treated copper foils, with the exception of sample 2, have peel strengths of 5.9 to 6.4 lbs/in. Thus post-treatment of the copper foils with an aqueous solution of bisphenol A-epichlorohydrin based epoxy resins have improved bond integrity.

EXAMPLE 3

Seven copper foils having the dimensions as disclosed in Example 1 were treated with the adhesion promotion solution of Example 1 about 60 seconds using the method and apparatus of Example 1. After treatment with the adhesion promotion composition, the copper foils of samples 1–6 were post-treated with a mixture of 1% aqueous solution of EPI-REZ® 3520-WY-55 with an aqueous solution of crosslinker DYCE having the concentrations disclosed in the table below. The post-treatment was performed at about 20°C. for about 60 seconds. Sample 7 was the control and was not post-treated.

| Sample | EPI-REZ ® % by weight | DYCE (% of EPI-REZ ® by weight) | Rinse | Peel Strength (lbs/in) |
| --- | --- | --- | --- | --- |
| 1 | 1 | 0.5 | YES | 6.1 |
| 2 | 1 | 0.5 | NO | 7.0 |
| 3 | 1 | 1 | YES | 7.3 |
| 4 | 1 | 1 | NO | 6.8 |
| 5 | 1 | 5 | YES | 7.0 |
| 6 | 1 | 5 | NO | 7.0 |
| 7 (control) | 0 | 0 | NO | 6.4 |

After post-treatment, some of the samples were rinsed with deionized water at about 20° C. All seven samples were pressed with Nelco® pre-preg as described in Example 1. The peel strength of each sample was determined using the Instron® Peel Tester. The results are disclosed in the table above.

The results show that the post-treatment mixture improved the peel strength of the copper foils. The control had a peel strength of 6.4 lbs/in. In contrast, the copper samples post-treated with the mixture had higher peel strengths, 6.8 to 7.3 lbs/in, with the exception of sample 1. Thus the post-treatment improves bond integrity between a mirco-roughened copper surface and a polymeric material.

Additionally, the addition of the DYCE to the EPI-REZ® 5522-WY-55 improved the peel strength in contrast to post-treatment compositions disclosed in Examples 1 and 2. The average peel strength in the present example is 7.3 lbs/in. In Example 1 the average peel strength is 6.2 lbs/in and in Example 2 the average peel strength is 6.0 lbs/in. Thus the addition of a crosslinker further improves the bond integrity between a micro-roughened surface of a metal and a polymeric material.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for treating a metal surface comprising:
   a) contacting the metal surface with an adhesion promotion composition comprising a mixture of an acid, oxidizer and corrosion inhibitor to form a micro-roughened conversion coated metal surface; and then
   b) contacting the micro-roughened conversion coated metal surface with an epoxy resin composition to prepare the metal surface for receiving a polymer material; and then
   c) placing the polymer material on the micro-roughened conversion coated metal surface.

2. The method of claim 1, wherein the epoxy resin has a general formula:

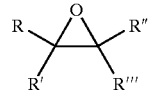

wherein R, R', R" and R'" may be, independently, hydrogen; alkyl; aryl; aralkyl; an alkoxy group; an epoxy group; a phenoxy group; a cycloaliphatic group; or a cyclic radical; the epoxy, phenoxy, alkyl, aryl, aralkyl and cycloaliphatic groups may be unsubstituted or substituted with an alkyl group, an arylkyl group, an amine group, or a halogen.

3. The method of claim 2, wherein the R', R", and R'" are hydrogen when R is alkyl, aryl, aralkyl or a cyclic radical.

4. The method of claim 2, wherein the halogen comprises bromine or chlorine.

5. The method of claim 2, wherein the alkyl groups have from one to twenty carbons.

6. The method of claim 2, wherein the epoxy resin is bisphenol A, novolak resins, bisphenol S, bisphenol F, cycloaliphatic epoxies, aliphatic epoxy, epoxy resins obtained from the reaction of bisphenol A and epihalohydrin, epoxy formulations based on glycidyl ethers of para amino phenols, or mixtures thereof.

7. The method of claim 1 wherein the epoxy resin composition is aqueous based, or organic based.

8. The method of claim 1, wherein the epoxy resin composition comprises epoxy resin at a concentration of from about 0.5% to about 5.0% by weight of the composition.

9. The method of claim 1, wherein the micro-roughened conversion coated metal surface is contacted with the epoxy resin composition for about 10 seconds to about one minute.

10. The method of claim 1, wherein the oxidizer is hydrogen peroxide.

11. The method of claim 10, where the hydrogen peroxide comprises from about 0.1% to about 20% by weight of the adhesion promotion composition.

12. The method of claim 1, wherein the acid comprises sulfuric acid, phosphoric acid or mixtures thereof.

13. The method of claim 1, wherein the corrosion inhibitor comprises pyrrols, azoles, oxazoles, thiazoles, pyrazoles, triazoles, benztriazoles, tetrazoles, tolyltriazoles, hydrozy-substituted azole compounds, imidazoles, benzimidazoles, or mixtures thereof.

14. The method of claim 1, wherein the corrosion inhibitor comprises from about 0.1% to about 20% by weight of the adhesion promotion composition.

15. The method of claim 1, further comprising an amine, a quaternary ammonium compound or mixtures thereof.

16. The method of claim 15, wherein the amines comprise primary, secondary, or tertiary amines having $C_1$ to $C_8$ substitution.

17. The method of claim 1, wherein the adhesion promotion composition is free of surfactants.

18. The method of claim 1, wherein the metal surface is copper or a copper alloy.

* * * * *